United States Patent [19]
Matsumoto et al.

[11] Patent Number: 5,352,941
[45] Date of Patent: Oct. 4, 1994

[54] CMOS/ECL LEVEL CONVERTING CIRCUIT

[75] Inventors: Toyomitsu Matsumoto; Noboru Yokota, both of Kawasaki, Japan

[73] Assignee: Fujitsu Limited, Kawasaki, Japan

[21] Appl. No.: 58,250

[22] Filed: May 10, 1993

[30] Foreign Application Priority Data

May 12, 1992 [JP] Japan .................. 4-118711

[51] Int. Cl.$^5$ .......................... H03K 19/092
[52] U.S. Cl. .................. 307/475; 307/443; 307/455; 307/559
[58] Field of Search ............ 307/443, 446, 455, 475, 307/551, 559, 561, 565, 264

[56] References Cited

U.S. PATENT DOCUMENTS

| | | | |
|---|---|---|---|
| 3,755,693 | 8/1973 | Lee | 307/559 X |
| 3,958,136 | 5/1976 | Schroeder | 307/559 X |
| 4,698,527 | 10/1987 | Matsumoto | 307/551 X |
| 4,808,858 | 2/1989 | Stoops | 307/551 X |
| 4,849,660 | 7/1989 | Hayashi et al. | 307/475 |
| 4,970,417 | 11/1990 | Kubota | 307/455 |
| 5,115,148 | 5/1992 | Kammerl et al. | 307/558 X |
| 5,216,298 | 6/1993 | Ohba et al. | 307/475 |

Primary Examiner—David R. Hudspeth
Attorney, Agent, or Firm—Staas & Halsey

[57] ABSTRACT

A bipolar transistor, connected between a high voltage source and a low voltage source, has a base connected to an input terminal. A clamp circuit is connected between the high voltage source and the base of the transistor. A first resistor is connected in parallel with the clamp circuit. An output terminal is connected to the emitter of the bipolar transistor. In one embodiment, the clamp circuit is formed by two diodes connected in series. In another embodiment, a second resistor for limiting current is provided between the input terminal and the base of the transistor. In yet another embodiment, the resistance value of the first resistor is smaller than the ON resistance of a pMOS transistor in the output circuit of a CMOS circuit connected to the input terminal. A high level from the output terminal produces a high level ECL level output with a potential that depends on $V_{BE}$ of the bipolar transistor, while a low level output depends on the level of the clamp circuit. High speed operation is obtained without fluctuation of the duty ratio and reduction of high potential level of the output signal from the output terminal.

20 Claims, 5 Drawing Sheets

CMOS/ECL LEVEL CONVERTING CIRCUIT

BACKGROUND OF THE INVENTION

This invention relates to a CMOS/ECL level converting circuit for converting a binary voltage level of a CMOS circuit into a binary voltage level of an ECL circuit. More particularly, this invention provides a CMOS/ECL level converting circuit having a more simple structure, outputting a signal having a fixed output level and a fixed duty ratio, and switching more quickly.

With rapid progress in the processing speed and integration density of computer systems, an ECL circuit which ensures high speed operation and a CMOS circuit which ensures high integration density and low power consumption are often formed in the same hybrid circuit. In such a hybrid circuit, a circuit for converting a voltage between the ECL level and CMOS level is provided in an input/output interface for high speed transfer of signals using the ECL level.

Figure 4:
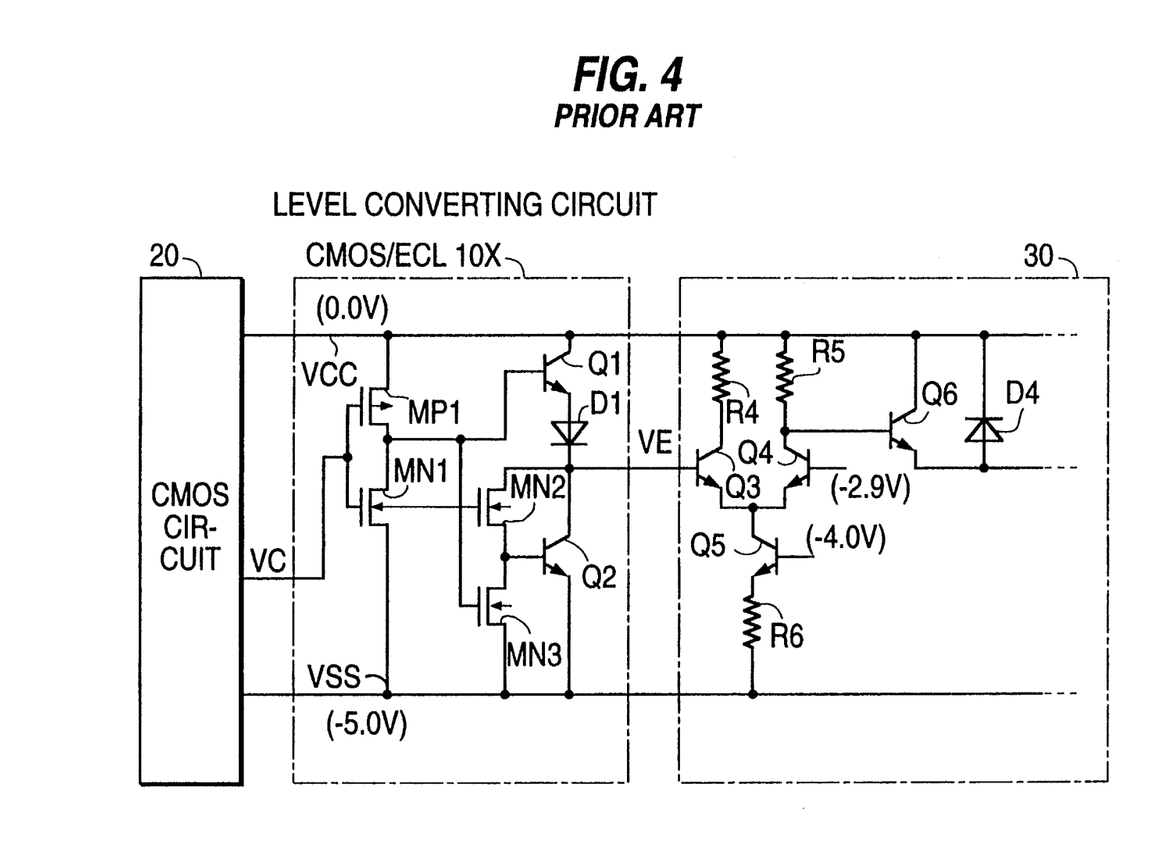
FIG. 4 is a structural diagram of a conventional CMOS/ECL level converting circuit.

FIG. 4 illustrates a structure of a conventional CMOS/ECL level converting circuit 10X which is formed of a Bi-CMOS circuit to ensure high speed operation. This CMOS/ECL level converting circuit 10X is connected between a CMOS circuit 20 and an ECL circuit 30 and is mounted on the same chip as the CMOS circuit 20 to convert a binary voltage level of the CMOS circuit into a binary voltage level of the ECL circuit on the occasion of transferring a signal to the ECL circuit 30 from the CMOS circuit 20.

Referring to FIG. 4, MP1 designates a pMOS transistor; MN1 to MN3 are nMOS transistors; Q1 to Q6 are NPN transistors; D1 and D4 are diodes; R4 to R6 are resistors; VCC is a power supply line for high voltage; and VSS is a power supply line for low voltage. When a potential of the power supply line VCC for high voltage is set to 0.0 V, a potential of the power supply line VSS for low voltage is −5.0 V.

When an input signal VC to be supplied to the CMOS/ECL level converting circuit 10X from CMOS circuit 20 is set to a high level (0.0 V), pMOS transistor MP1, nMOS transistor MN3 and NPN transistor Q1 turn OFF, while nMOS transistors MN1, MN2 and NPN transistor Q2 turn ON and an output signal VE is supplied to the ECL circuit 30 from the CMOS/ECL level converting circuit 10X. The output signal VE has the base potential of the NPN transistor Q3 which is about −4.2 to −4.3 V. This potential can be calculated from a formula, $VSS + V_{BE}(Q2) + $ (voltage drop by ON resistance at NM2). This potential is also equal to $Vcc - $ (voltage drop at R4) $- V_{CB}(Q3)$.

When an input signal VC is set to a low level (−5.0 V), the pMOS transistor MP1, nMOS transistor MN3 and NPN transistor Q1 turn ON, while nMOS transistors MN1, MN2 and NPN transistor Q2 turn OFF and the output signal VE becomes about −1.6 V. This potential is equal to $VCC - V_{BE}(Q1) - $ (voltage drop at D1). Therefore, a reference voltage of −2.9 V which is an intermediate level of the high and low levels is applied to the base of the NPN transistor Q4.

Figure 5:
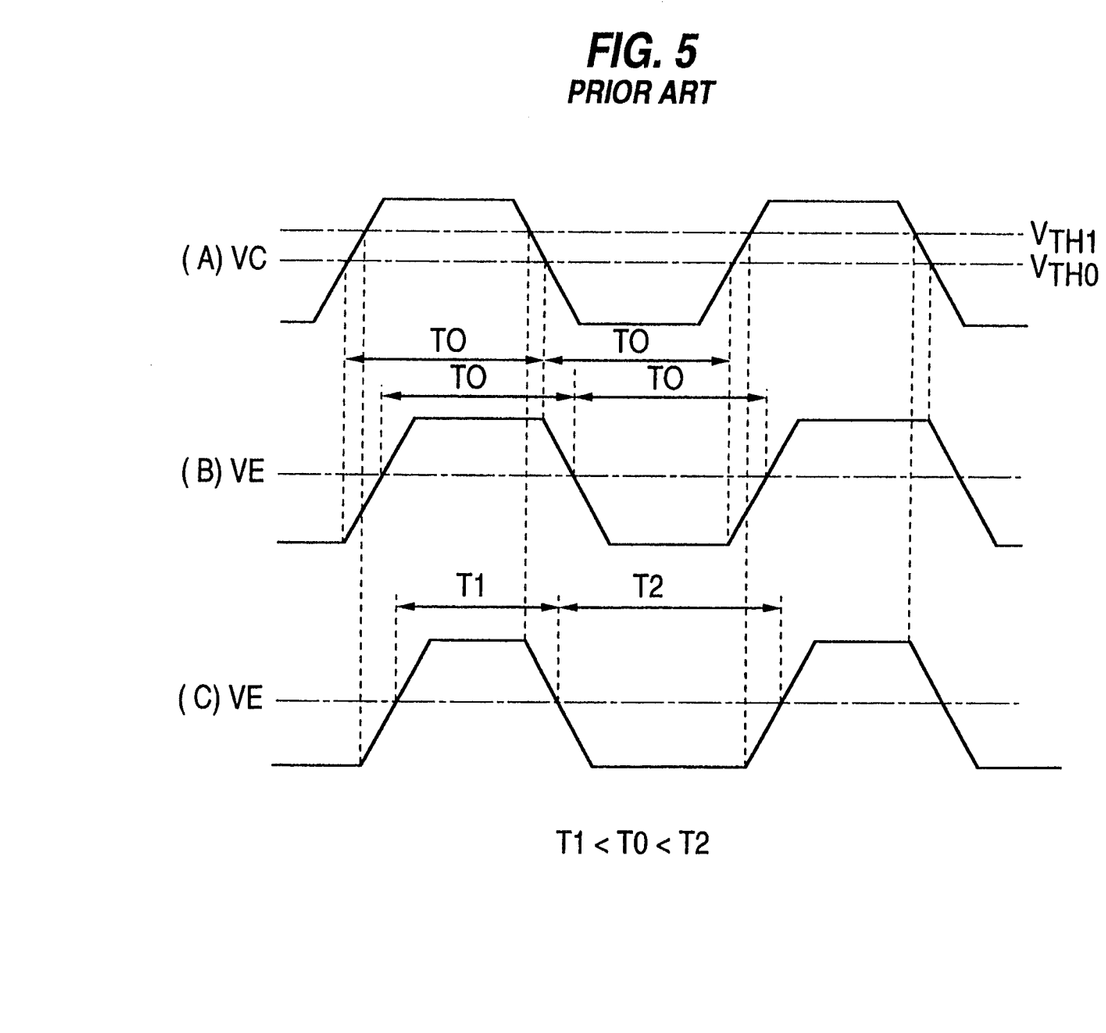
FIG. 5 is a diagram indicating voltage waveforms for explaining problems of the prior art.

However, since a structure of the CMOS/ECL level converting circuit 10X is complicated, chip area required is large. Moreover, the duty ratio of input signal VC does not match the duty ratio of output signal VE due to fluctuation of ON resistance of pMOS transistor MP1. For example, in FIG. 5, when a threshold voltage of the CMOS/ECL level converting circuit 10X is VTH0 for the input signal VC having the duty ratio of 50% as shown in (A), an output signal VE has the duty ratio of 50% as shown in (B), but when a threshold voltage of the CMOS/ECL level converting circuit 10X becomes VTH1 due to fluctuation of ON resistance of the pMOS transistor MP1, the duty ratio of an output signal VE is deviated from 50% as shown in (C).

SUMMARY OF THE INVENTION

In view of solving the problems mentioned above, an object of this invention is to provide a CMOS/ECL level converting circuit which ensures high speed operation.

Another object of this invention is to provide a CMOS/ECL level converting circuit having a simplified structure.

A further object of this invention is to provide a CMOS/ECL level converting circuit reducing deviation of duty ratio of an input/output signal.

An additional object of this invention is to provide a CMOS/ECL level converting circuit having smaller fluctuation of a high level output signal.

To achieve the foregoing objects and in accordance with the purpose of the invention, as embodied and broadly described herein, the level converting circuit for converting a CMOS level signal outputted from a CMOS circuit into an ECL level signal which is available to an ECL circuit, comprises: a high voltage source, a low voltage source, a bipolar transistor provided between the high voltage source and the low voltage source, having a base connected to an input terminal receiving the CMOS level signal, a clamp circuit connected between the high voltage source and the base of the bipolar transistor, a first resistor connected in parallel with the clamp circuit, and an output terminal, connected to an emitter of the bipolar transistor, outputting the ECL signal.

The CMOS circuit includes an output circuit comprising a CMOS inverter circuit which comprises a pMOS transistor and a nMOS transistor connected in series, furthermore, the CMOS level signal is outputted from a connection point between the pMOS transistor and nMOS transistor, and the first resistor is connected in parallel with the pMOS transistor. According to a preferred embodiment, a resistance value of the first resistor is lower than an ON resistance value of the P-MOS transistor.

The ECL circuit includes an input circuit comprising a comparator having a reference voltage level, and a clamp potential level arranged such that the low level of the ECL level signal is lower than the reference voltage level.

In one embodiment of this invention, the first resistor is formed adjacent to the bipolar transistor.

According to this invention, this level converting circuit further comprises current limiting means between the base of the bipolar transistor and the input terminal. The current limiting means usually comprises a second resistor. Also, it is preferable to provide a diode connected in parallel with the second resistor.

More specific structure of this invention comprises a high voltage source, a low voltage source, an input terminal connected to a CMOS circuit, an output terminal connected to an ECL circuit, a bipolar transistor provided between the high voltage source and the low voltage source, at least one clamp diode connected between the high voltage source and a base of the bipolar transistor, a first resistor connected in parallel with the clamp diode(s), a second resistor connected between the base of the bipolar transistor and the input terminal, and a current source connected between an emitter of the bipolar transistor and the low voltage source.

These objects, together with other objects and advantages which will be subsequently apparent, reside in the details of construction and operation as more fully hereinafter described and claimed, reference being had to the accompanying drawings forming a part hereof, wherein like reference characters refer to like parts throughout.

DETAILED DESCRIPTION OF THE PREFERRED EMBODIMENTS

Figure 1:
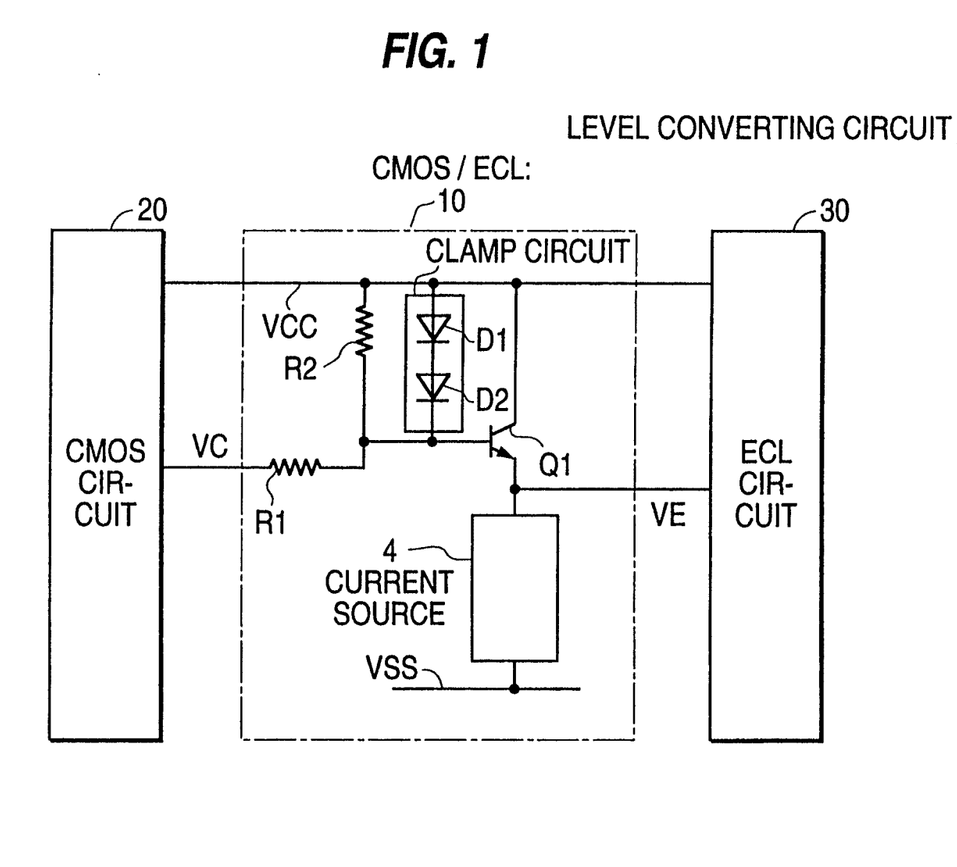
FIG. 1 is a structural diagram of a CMOS/ECL level converting circuit illustrating the principle structure of the present invention.

FIG. 1 illustrates a principle structure of a CMOS/ECL level converting circuit of the present invention. According to the invention, the base of NPN transistor Q1 is connected with a first end of a clamp circuit comprising two or three stages of diodes D1, D2 connected in series, a first end of a resistor R1 and a first end of a resistor R2. The second end of the clamp circuit and the collector of the NPN transistor Q1 are connected to a high voltage source Vcc. The emitter of the NPN transistor Q1 is connected to a low voltage source VSS via a current source A. The second end of the resistor R1 receives an input signal VC, while the emitter of the NPN transistor Q1 provides an output signal VE.

According to this invention, the current source A may be a constant current source or a third resistor to provide current source means.

The resistor R2 is provided for reducing a voltage drop by the resistor R1 when the input signal VC is at the high level and it should preferably have a small resistance value. The resistance value of the resistor R2 may be, for example, several KΩ which is enough for the diodes D1, D2 to clamp a base potential of the NPN transistor Q1 when the input signal VC has a low level. The resistor R1 is provided for limiting a current, when the input signal VC is at a low level, flowing into the side of CMOS circuit 20 passing through the resistor R1. A smaller resistance value of the resistor R1 enables operations at higher speed, but the minimum resistance value depends on the driving capability of the output stage of the CMOS circuit 20. A third resistor or constant current source A is provided to limit a current when the NPN transistor Q1 is in the ON state.

Next, operations according to this invention structured as explained above will be explained. When input signal VC shifts to a high level VCC, the base potential of the NPN transistor Q1 quickly becomes equal to the potential VCC and output signal VE is reduced to VEH=VCC−$V_{BE}$(Q1). That is, the potential of VE is lower than VC due to the base-emitter voltage VBE of the NPN transistor Q1. The base-emitter voltage $V_{BE}$ is about 0.7 to 0.8 V.

When the input signal VC is at a low level VSS, the base potential of the NPN transistor Q1 quickly becomes equal to VCC−$V_{D1}$−$V_{D2}$ due to the clamping effect of the diodes D1, D2, and output signal VE is reduced to VEL=VCC−$V_{D1}$−$V_{D2}$−$V_{BE}$(Q1). That is, the potential level of VE is lower than VCC−$V_{D1}$−$V_{D2}$ due to the base-emitter voltage $V_{BE}$ of the NPN transistor Q1. The forward voltages $V_{D1}$, $V_{D2}$ of the diodes are about 0.7 to 0.8 V like the base-emitted voltage $V_{BE}$.

According to this invention, high speed operations are ensured and the structure is simplified. The high level VEH is determined by the base-emitter voltage $V_{BE}$ of the NPN transistor Q1 and the low level VEL is determined by a sum of the voltage across the terminals of diodes D1, D2 an the base-emitter voltage $V_{BE}$ of the NPN transistor Q1. As a result, deviation of the duty ratio of the input and output of the CMOS/ECL level converting circuit 10 can be reduced from that in FIG. 4.

In FIG. 1, the diodes D1, D2 are connected in series in two stages but the same effect can also be realized when three diodes are connected in series.

Figure 2:
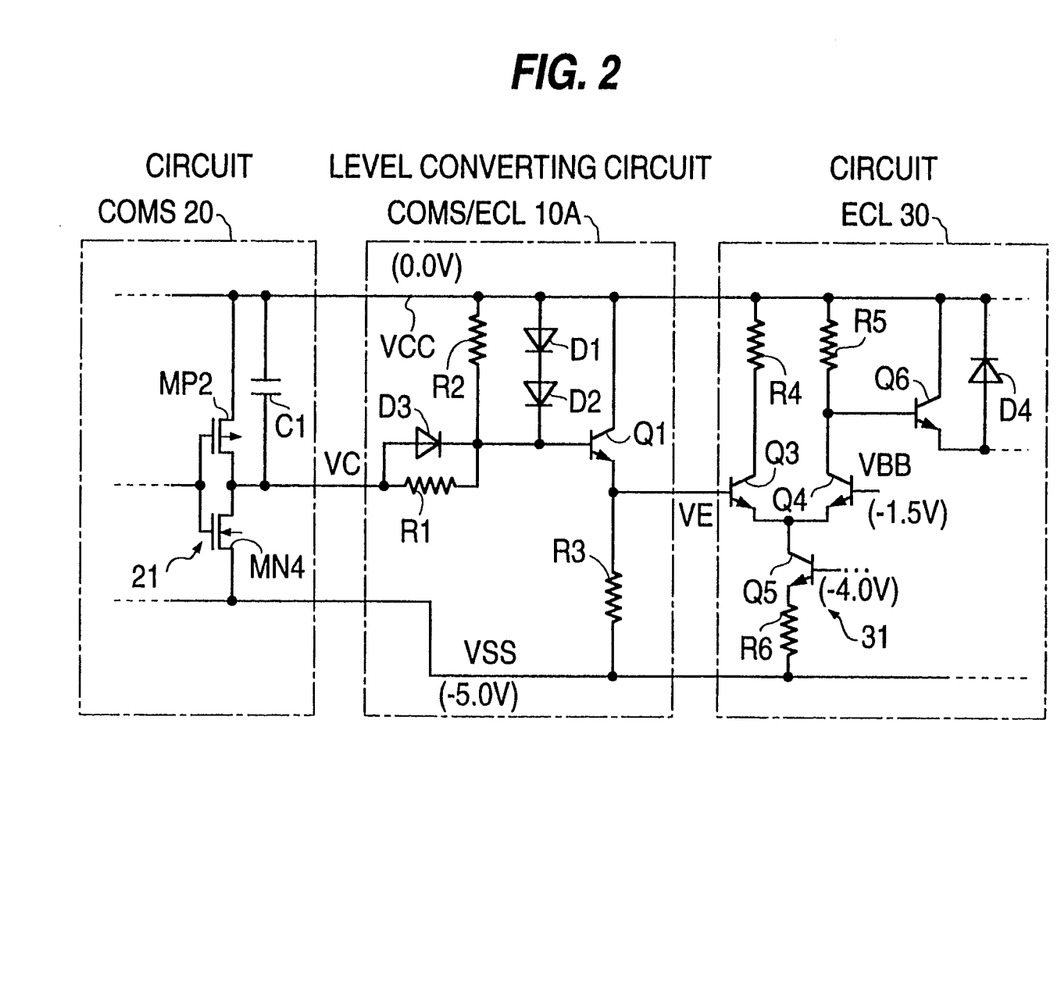
FIG. 2 is a structural diagram of a CMOS/ECL level converting circuit of an embodiment of the present invention.

According to this invention, the first and second ends of the second resistor R1 are connected, as shown in FIG. 2, with the cathode and anode of the diode D3, respectively. Using this structure, the input signal VC rises more quickly than in the conventional art, namely, higher speed operation can be realized.

A preferred embodiment of the present invention will be explained in detail by referring to the accompanying drawings. FIG. 2 illustrates the structure of a CMOS-/ECL level converting circuit as a preferred embodiment of the present invention. This CMOS/ECL level converting circuit 10A is provided between the CMOS circuit 20 and the ECL circuit 30 to convert a binary voltage level of the CMOS circuit into a binary voltage level of the ECL circuit 30 on the occasion of transmitting a signal to the ECL circuit 30 from the CMOS circuit 20.

This CMOS/ECL level converting circuit 10A is mounted on the same chip together with the CMOS circuit 20 in this embodiment. However, it is possible to form the CMOS/ECL level converting circuit 10A on a separate chip from the CMOS circuit 20. Also it is possible to form the CMOS circuit, the level converting circuit and the ECL circuit on the same chip.

In the CMOS/ECL level converting circuit 10A, the base of NPN transistor Q1 is connected with the first end of a clamp circuit. The clamp circuit comprises two normal type diodes D1, D2 connected in series in this embodiment. The base of NPN transistor Q1 is also connected to the first end of a resistor R1, the first end of a resistor R2 and the cathode of diode D3. The collector of NPN transistor Q1, the anode of diode D1 and the second end of resistor R2 are connected to a high voltage source VCC. The emitter of NPN transistor Q1 is connected to a lower voltage source VSS through a current source resistor. Resistor R3 is used for this current source. In addition, a constant current source circuit can be used in place of the resistor R3. Moreover, the anode of diode D3 and the second end of resistor R1 are connected in common to operate as the signal input terminal of the CMOS/ECL level converting circuit 10A. The signal output terminal of the CMOS/ECL level converting circuit 10A is the emitter of NPN transistor Q1.

On the other hand, an output stage of the CMOS circuit 20 is provided with a CMOS inverter 21 consisting of pMOS transistor MP2 and nMOS transistor MN4. An output end of the CMOS inverter 21 is connected to the input terminal of the CMOS/ECL level converting circuit 10A via a signal line having a wiring capacitance C1. The high level (VCC) of the CMOS circuit is 0 V and the low level (VSS) is −5 V.

Moreover, the input stage of the ECL circuit 30 is provided with a ECL gate 31 (comparator) consisting of NPN transistors Q3 to Q5 and resistors R4 to R6 and the output stage of the CMOS/ECL level converting circuit 10A is connected with the base of NPN transistor Q3. A reference voltage, for example, of $V_{BB}=-1.5$ V is applied to the base of NPN transistor Q4. At the emitter of the transistor Q6, for example, a high level is −0.9 V and a low level is −1.7 V.

In this embodiment, resistance values of the resistors in FIG. 2 are, for example, R1=5 KΩ, R2=5 KΩ, R3=7 KΩ, R4=247Ω, R5=247Ω, R6=86 Ω.

In the CMOS/ECL level converting circuit 10A, the resistor R1 is provided to limit a current flowing into the side of CMOS circuit 20 passing through the resistor R1 when an input signal VC is low level. A smaller resistance value of resistor R1 provides higher speed operation but the minimum resistance value depends on the driving capability of the CMOS inverter 21 in the output stage of the CMOS circuit 20.

The resistor R2 reduces the voltage drop due to the resistor R1 when input signal VC is high level and a small resistance value is preferable. When VC becomes high level, a base current flows from the input terminal of the level converting circuit to the base of NPN transistor Q1 through the resistor R1. A voltage drop occurs across the resistor R1 and the potential level of the base of NPN transistor Q1 becomes lower than VCC level. So, in this invention, resistor R2 is essentially connected in parallel with resistor R1 and the total resistance value is reduced. Therefore, voltage drop at resistor R1 can be reduced.

Resistance values of resistors R1 and R2 is defined as following formula.

When VE is low level
$V_{D1}+V_{D2}+I(R1+$ ON resistance of MN4$)=$VCC$-$VSS
VE$=V_{D1}+V_{D2}+V_{BE}$(Q1)$=B_{BB}-0.3\sim 0.4$ V When VE is high level
VE$=V_{BB}+0.3\sim 0.4$  V$=V_{BE}$(Q1)$+I_E$(Q1)$\times(1/h_{FE})$(R1//R2)

Where,
$V_{D1}$, $V_{D2}$: voltage drop at diodes
I: current flowing through R1 and MN4
$V_{BE}$(Q1): voltage between base and emitter of transistor Q1
$I_E$(Q1): emitter current of a transistor Q1
$h_{FE}$: current amplification factor of transistor Q1
R1//R2: resistance value for parallel connection of R1 and R2

The resistor R2 has another function. The resistor R2 is connected in parallel with pMOS transistor MP2 in the output circuit of the CMOS circuit. The pMOS transistor MP2 has an ON resistance value that fluctuates easily, due to manufacturing deviations. This fluctuation leads to fluctuation of the duty ratio and the potential level of the output signal of the CMOS circuit. On the other hand, fluctuation of the resistance value of resistor R2 due to manufacturing deviations can be smaller than that of the ON resistance. So where the resistance value of the resistor R2 is smaller than that of ON resistance of pMOS transistor MP2, the potential level at the base of NPN bipolar transistor Q1 is fixed by the resistor R2 which is less likely to change its resistance value than pMOS transistor MP2, when VC has a high level. Also, the switching speed of VC for changing from low level to high level can be improved by the resistance R2.

Furthermore, it is preferable for the resistor R2 to be formed close to the NPN transistor Q1. A conductor resistance exists between the output part of the CMOS circuit and the base of NPN transistor Q1. Where the distance therebetween is relatively long, a potential level at the base of NPN transistor Q1 is affected by the conductor resistance value. Where the resistor R2 is formed close to the transistor Q1, the potential level is fixed by the resistor R2, and is not affected by the conductor resistance.

A resistance value of the resistor R2 is, for example, several KΩ which is enough for the diodes D1 and D2 to clamp the base potential of the NPN transistor Q1 when input signal VC is low level. The resistor R3 is provided to limit a current when the NPN transistor Q1 is ON and it may also be replaced with a current source.

In regard to the clamp circuit, a clamped level is arranged such that when VC is low level, the potential level of output signal VE of the level converting circuit is lower than that of $V_{BB}$ which is a reference level of the ECL GATE 31. In this embodiment the potential level of VE must be lower than −1.5 V of $V_{BB}$ when the VE is low level. Where the voltage between the base and emitter of the transistor Q1 is 0.8 V, the voltage drop at diodes D1 and D2 are 0.8 V, the low level of VE is −2.4 V (VCC$-V_{D1}-V_{D2}-V_{BE}$(Q1)) which is lower than the $V_{BB}$ level.

The two-stage diodes D1 and D2 connected in series may be structured in three stages. If the clamp circuit is structured as a single stage of a conventional diode, the amplitude of output signal VE becomes too small (−1.6 V) and if it is structured in four stages or more, the level of output signal VE is excessively lowered and thereby the base potential of the NPN transistor Q5 becomes higher than the collector potential, causing the NPN transistor Q5 to be saturated. The diode D3 is provided to quickly raise the rising edge of the input signal VC.

The number of diodes depends on the potential level of VCC and the reference level of $V_{BB}$. In this embodiment, VCC is 0 V and VSS is −5.0 V. However in another embodiment VCC is 5 V and VSS is 0 V.

Furthermore, in this embodiment, the clamp circuit is composed only of diodes. However, it is possible to use a combination of at least one diode and a resistor connected in series. Moreover a plurality of Schottky type diodes can be used as the clamp circuit. In this embodiment, two normal type diodes are used. Instead of these two diodes, four Schottky type diodes connected in series can be used.

Figure 3:
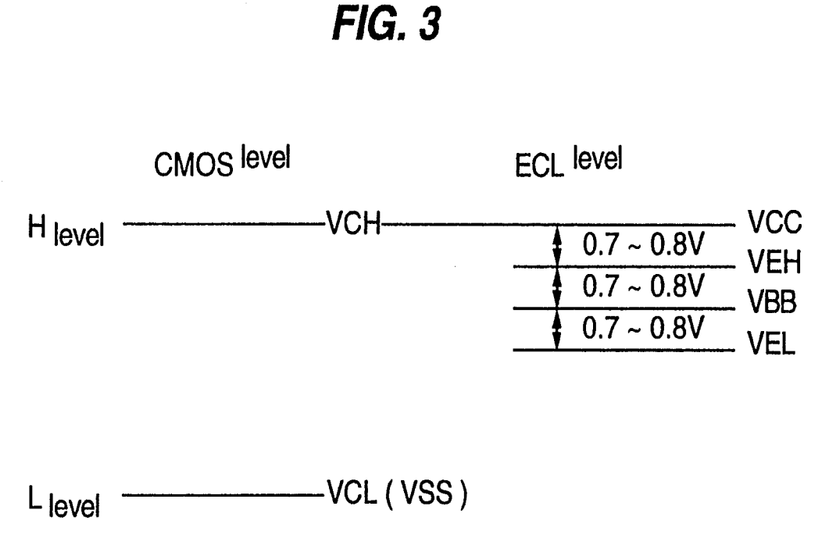
FIG. 3 is a diagram illustrating input/output levels of the CMOS/ECL level converting circuit of FIG. 2.

Operations of this embodiment structured as explained above will now be explained. FIG. 3 indicates input/output levels of the CMOS/ECL level converting circuit of FIG. 2. In FIG. 3, the potentials VCH and VCL respectively indicate the high level and low level of the CMOS circuit 20, while the potentials VEH and VEL indicate the high level and low level of the ECL circuit 30 and the potential $V_{BB}$, indicates the base potential of the NPN transistor Q4.

When the input signal VC shifts to the high level (0.0 V), the base potential of the NPN transistor Q1 quickly shifts to 0.0 V and the output signal VE is reduced to about −0.7 to −0.8 V which is lower than the base potential of transistor Q1 by the base-emitter voltage $V_{BE}$. Thereby, the base potential of the NPN transistor Q6 rises, turning ON the NPN transistor Q6.

When the input signal VC shifts to the low level (−50 V), the base potential of the NPN transistor Q1 quickly shifts to −1.4 to −1.6 V due to the clamping effect of the diodes D1 and D2 and thereby the output voltage VE is reduced to about −2.1 to −2.4 V which is lower than the base potential of transistor Q1 by the base-emitter voltage $V_{BE}$ of the NPN transistor Q1. Thereby, the base potential of the transistor Q6 is lowered, turning OFF the NPN transistor Q6.

In this embodiment, high speed operation is realized with a simplified structure and moreover since the high level VEH is determined by a base-emitter voltage $V_{BE}$ of the NPN transistor Q1 and the low level VEL is determined by a sum of a terminal-to-terminal voltage of the diodes D1, D2 and a base-emitter voltage $V_{BE}$ of the NPN transistor Q1, deviation of input/output duty ratios of the CMOS/ECL level converting circuit 10A can be reduced compared to the deviation present in the circuit illustrated in FIG. 4.

As explained heretofore, the CMOS/ECL level converting circuit of the invention enables high speed operation with a simplified structure and moreover provides such an excellent effect that the input/output duty ratios of the CMOS/ECL level converting circuit has little deviation, compared to that of the conventional circuit, realizing much contribution to high integration density of the circuit. In addition, the invention ensures higher speed operation.

The many features and advantages of the present invention are apparent from the detailed specification, and thus it is intended by the appended claims to cover all such features and advantages of the circuit which fall within the true spirit and scope of the invention. Further, since numerous modification and changes will readily occur to those skilled in the art from the disclosure of this invention, it is not desired to limit the invention to the exact construction and operation illustrated and described, accordingly, suitable modifications and equivalents may be resorted to, all falling within the scope and spirit of the invention.

We claim:

1. A level converting circuit for converting a CMOS level signal received via an input terminal from a CMOS circuit into an ECL level signal supplied via an output terminal to an ECL circuit, said level converting circuit comprising:
    a high voltage source;
    a low voltage source;
    a bipolar transistor coupled between said high voltage source and said low voltage source, having a base connected to the input terminal receiving said CMOS level signal and an emitter connected to the output terminal to supply the ECL level signal;
    a clamp circuit, connected between said high voltage source and the base of said bipolar transistor, to clamp a potential level at the emitter when the input signal has a low logic level; and
    a first resistor connected in parallel with said clamp circuit.

2. The level converting circuit of claim 1, wherein the CMOS circuit includes an output circuit including a CMOS inverter circuit having a pMOS transistor and a nMOS transistor connected in series with a connection point therebetween, the CMOS level signal being outputted form the connection point between said pMOS and nMOS transistors, and
    wherein said first resistor is connected in parallel with said pMOS transistor.

3. The level converting circuit of claim 2, wherein said first resistor has a resistance value lower than an ON resistance value of said pMOS transistor.

4. The level converting circuit of claim 1, wherein the ECL circuit includes an input circuit including a comparator having a reference voltage level, and
    wherein said clamp circuit has a clamp potential producing a low level of the ECL level signal lower than the reference voltage level.

5. The level converting circuit of claim 4, wherein said clamp circuit comprises diodes connected in series between said high voltage source and the base of said bipolar transistor.

6. The level converting circuit of claim 4, wherein said clamp circuit comprises a diode and a resistor in series between said high voltage source and the base of said bipolar transistor.

7. The level converting circuit of claim 4, wherein said clamp circuit comprises Schottky barrier type diodes between said high voltage source and the base of said bipolar transistor.

8. The level converting circuit of claim 1, wherein said first resistor is formed adjacent said bipolar transistor.

9. The level converting circuit of claim 1, wherein said level converting circuit is formed on a single chip with the CMOS circuit.

10. The level converting circuit of claim 1, further comprising current limiting means for limiting a current flowing between the base of said bipolar transistor and the input terminal.

11. The level converting circuit of claim 10, wherein said current limiting means comprises a second resistor coupled between the input terminal and the base of said bipolar transistor.

12. The level converting circuit of claim 11, wherein said current limiting means further comprises a diode connected in parallel with said second resistor.

13. The level converting circuit of claim 1, further comprising current source means for limiting a current flowing between the emitter of said bipolar transistor and said low voltage source.

14. The level converting circuit of claim 13, wherein said current source means comprises a third resistor connected between the emitter of said bipolar transistor and said low voltage source.

15. A level converting circuit for converting a CMOS level signal outputted from a CMOS circuit into an ECL level signal supplied to an ECL circuit, said level converting circuit comprising:
    a high voltage source;
    a low voltage source;
    an input terminal connected to the CMOS circuit;
    an output terminal connected to the ECL circuit;
    a bipolar transistor, coupled between said high voltage source and said low voltage source, having a base and an emitter;
    at least one clamp diode connected between said high voltage source and the base of said bipolar transistor to clamp a potential level at the emitter when the input signal has a low logic level;

a first resistor connected in parallel with said at least one clamp diode;

a second resistor connected between the base of said bipolar transistor and said input terminal; and current source means connected between the emitter of said bipolar transistor and said low voltage source.

16. The level converting circuit of claim 15, wherein said at least one clamp diode comprises two diodes connected in series between said high voltage source and the base of said bipolar transistor.

17. The level converting circuit of claim 15, wherein said current source means comprises a third resistor connected between the emitter of said bipolar transistor and said low voltage source.

18. The level converting circuit of claim 15, further comprising a diode connected parallel with said second resistor.

19. A level converting circuit for converting a CMOS level signal outputted from a CMOS circuit into an ECL level signal supplied to an ECL circuit, the CMOS circuit having an output circuit including an inverter formed by a pMOS transistor and a nMOS transistor connected in series to form a connection point therebetween, said level converting circuit comprising:

a high voltage source;

a low voltage source;

an input terminal connected to the connection point between the pMOS and nMOS transistors in the output circuit of the CMOS circuit;

an output terminal connected to the ECL circuit;

a bipolar transistor, coupled between said high voltage source and said low voltage source, having a base and an emitter;

at least one clamp diode connected between said high voltage source and the base of said bipolar transistor to clamp a potential level at the emitter when the input signal has a low logic level;

a first resistor connected in parallel with said at least one clamp diode;

a second resistor connected between the base of said bipolar transistor and said input terminal; and current source means connected between an emitter of said bipolar transistor and said lower voltage source.

20. The level converting circuit of claim 19, wherein said first resistor has a resistance value lower than an ON resistance value of the pMOS transistor in the output circuit of the CMOS circuit.

* * * * *